United States Patent
Tseng

[11] Patent Number: 5,811,339
[45] Date of Patent: Sep. 22, 1998

[54] METHOD OF FABRICATING DEEP SUBMICRON MOSFET WITH NARROW GATE LENGTH USING THERMAL OXIDATION OF POLYSILICON

[75] Inventor: Horng-Huei Tseng, Hsinchu, Taiwan

[73] Assignee: Vanguard International Semiconductor Corporation, Hsinchu, Taiwan

[21] Appl. No.: 712,148

[22] Filed: Sep. 11, 1996

[51] Int. Cl.$^6$ .................................................. H01L 21/336
[52] U.S. Cl. .................... 438/289; 438/291; 438/299; 438/526; 438/585; 438/947
[58] Field of Search ................................. 438/282, 289, 438/290, 291, 299, 300, 526, 576, 577, 578, 585, 589, 700, 702, 945, 947, 177, 193, 463, 479

[56] References Cited

U.S. PATENT DOCUMENTS

| | | |
|---|---|---|
| 4,256,514 | 3/1981 | Pogge . |
| 4,359,816 | 11/1982 | Abbas et al. ............................. 438/289 |
| 4,845,046 | 7/1989 | Shimbo ................... 438/300 |
| 5,073,512 | 12/1991 | Yoshino ............... 438/291 |
| 5,082,794 | 1/1992 | Pfiester et al. .......................... 438/289 |
| 5,484,743 | 1/1996 | Ko et al. .................. 438/290 |
| 5,576,574 | 11/1996 | Hong ........................................ 438/291 |
| 5,658,811 | 8/1997 | Kimura et al. ........................... 438/289 |
| 5,668,021 | 9/1997 | Subramanian et al. ................. 438/282 |

FOREIGN PATENT DOCUMENTS

| | | | |
|---|---|---|---|
| 6-45360 | 2/1994 | Japan ..................................... 438/177 |

OTHER PUBLICATIONS

S.A. Abbas et al., IBM Tech. Discl. Bulletin, 20(4)(1977)1376 "Extending the minimal dimensions of photolithographic . . . ", Sep. 1977.

Primary Examiner—Charles L. Bowers, Jr.
Assistant Examiner—Leon Radomsky
Attorney, Agent, or Firm—Christensen, O'Connor Johnson & Kindness PLLC

[57] ABSTRACT

The present invention relates to forming a narrow gate MOSFET having a local ion implantation to reduce the junction capacitance. A polysilicon layer is formed over a semiconductor substrate. An opening is formed in the polysilicon layer by using patterning and etching. Subsequently, a thermal oxidation is performed to oxidize the polysilicon layer into a polysilicon-oxide layer that is expanded in volume relative to the polysilicon layer thereby narrowing said opening. Then an ion implantation is performed by using said polysilicon-oxide layer as a mask.

14 Claims, 2 Drawing Sheets

METHOD OF FABRICATING DEEP SUBMICRON MOSFET WITH NARROW GATE LENGTH USING THERMAL OXIDATION OF POLYSILICON

FIELD OF THE INVENTION

The present invention relates to a method of fabricating a MOSFET, and more specifically, to a method of forming a MOSFET having a narrow gate length.

BACKGROUND OF THE INVENTION

In many MOS IC applications, it is critical to be able to establish and maintain a uniform and stable value of threshold voltage (Vt). Vt is determined by connecting the drain and gate of the MOSFET together and measuring the drain current as a function of gate voltage.

Vt is normally adjusted by implanting a thin layer of impurities (boron or arsenic) at the Si surface. See *Silicon Processing for the VLSI Era, Vol. 1—Process Technology,* S. Wolf and R. N. Tauber, Lattice Press, 1986, p. 325. A typical value of Vt in NMOSFETs is 0.7 V. One parameter that impacts Vt is the work function difference between the gate and the semiconductor substrate. See *Modular Series on Solid State Devices,* Vol. IV, R. F. Pierret et al., Addison-Wesley Publishing, 1983, pp. 59–64. While the work function of the gate is constant, the work function of the substrate depends on the substrate doping. Thus, changes in the substrate doping concentration produce changes in Vt. Merely increasing the substrate doping, however, is not desirable because it will adversely impact other MOSFET characteristics, such as lowering the junction-breakdown voltage and enlarge junction capacitances.

Prior to the development of ion implantation in the early 1970s, adjustment of the substrate doping was the only practical processing approach for significantly controlling the Vt in active devices (see *Silicon Processing for the VLSI Era, Vol. 1—Process Technology,* S. Wolf and R. N. Tauber, Lattice Press, 1986). Ion implantation can be used either to increase or decrease the net dopant concentration at the silicon surface. As a result, substrate doping can be selected on the basis of optimum device performance since Vt can now be set by the Vt adjustment implant process.

It has further been the trend in integrated circuit technology to increase the density of semiconductor devices per unit area of silicon wafer. It follows then that the semiconductor devices, such as transistors and capacitors, must be made smaller and smaller. However, one area which poses as a significant barrier to the miniaturization of semiconductor devices is photolithography. In particular, the problem of "registration" accuracy arises. Registration refers to the aligning of a mask to the semiconductor wafer to ensure that the mask is correctly positioned atop the features of the wafer. For a further discussion of registration, the reader is invited to review *Silicon Processing for the VLSI Era, Vol. 1—Process Technology,* S. Wolf and R. N. Tauber, Lattice Press, 1986, pp. 473–476.

Furthermore, as the dimension of the gate is reduced, the threshold voltage of the MOSFETs become less well predicted by the long channel Vt. It has been found that Vt is decreased when the gate length is decreased. In other words, the threshold voltage will shift in short channel MOSFETs. The decrease of Vt with the gate dimension in short channel devices is crucial because enhancement-mode FETs in CMOS are generally designed to operate with Vt of 0.6–0.8V. If the magnitude of Vt drops even slightly below its designed value, the device may exhibit excessive drain leakage current.

If short channel effects reduce Vt below the long channel values, the channel doping concentration must be increased to reestablish the desired Vt. Higher channel doping, however, generally degrades other device characteristics, such as junction capacitance and saturation characteristics.

Thus, there are significant problems in fabricating narrow channel MOSFETs that have a Vt that can be easily controlled while maintaining performance characteristics. The present invention solves these and other problems of the prior art.

SUMMARY OF THE INVENTION

A method of forming a gate for a MOS transistor on a semiconductor substrate is disclosed. The method comprises the steps of forming a gate oxide layer on said semiconductor substrate; forming a first polysilicon layer on said gate oxide layer; forming a dielectric layer on said first polysilicon layer for isolating said first polysilicon layer; forming a second polysilicon layer on said dielectric layer; etching said second polysilicon layer to form an opening in said second polysilicon layer; oxidizing said second polysilicon layer into a polysilicon-oxide layer that is expanded in volume relative to said second polysilicon layer thereby narrowing said opening; performing a local threshold voltage implant by using said polysilicon-oxide layer as an ion implant mask to dope ions into said substrate; forming a metal in said opening; removing said polysilicon-oxide layer; removing said dielectric layer; and patterning and etching said first polysilicon layer to form a gate of said MOS.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In the present invention, a new method is disclosed to form a deep submicron MOSFET with a narrow gate smaller than that of the photolithography limit. The formation of the present invention includes many process steps that are well known in the art. For example, the process of photolithography masking and etching is used extensively herein. This process consists of creating a photolithography mask containing the pattern of the component to be formed, coating the wafer with a light sensitive material known as a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and stripping the remaining photoresist. This photolithography masking and etching process are referred to as "patterning and etching." Additionally, it should be pointed out that the method described herein includes many conventional process steps that are well known in the art. Each of these steps are conventional and will not be described in detail herein.

Figure 1:
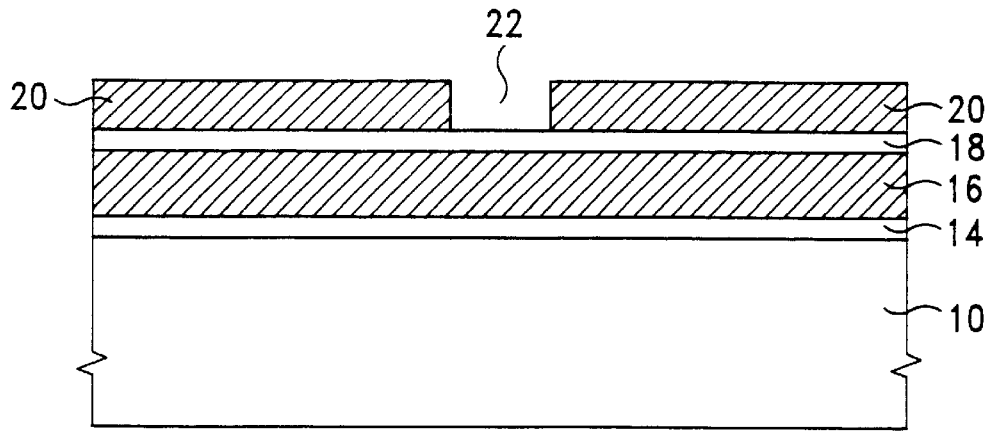
FIG. 1 is a cross section view of a semiconductor wafer illustrating the step of forming a gate oxide layer, a first polysilicon layer, a nitride layer, a second polysilicon layer and forming an opening in the second polysilicon layer in accordance with the present invention.

Turning to FIG. 1, a single crystal substrate 10 is used. Preferably, the single crystal substrate 10 is P-type with a <100> crystallographic orientation. A thick field oxide region (not shown), FOX, is also created for purposes of isolation. Generally speaking, the FOX region is created via photolithography and dry etching steps to etch a silicon nitride-silicon dioxide composite layer. After the photoresist is removed and wet cleaned, a thermal oxidation in an oxygen-steam ambient is used to form the FOX region, to a thickness of about 3000–6000 angstroms.

Initially, a silicon dioxide layer 14 is created atop the substrate 10 to act as the gate oxide. In the preferred embodiment, the silicon dioxide layer 14 is formed by using an oxygen-steam ambient, at a temperature of between about 850° to 1000° C. Alternatively, the gate oxide 14 may be formed using other known oxide chemical compositions and procedures. As is known in the art, by controlling the pressure and amount of time at which the oxygen-steam ambient is exposed to the substrate, the thickness of the silicon dioxide layer 14 can be easily controlled. In the preferred embodiment, the thickness of the silicon dioxide layer 14 is approximately 50–200 angstroms.

Still referring to FIG. 1, after the first silicon dioxide layer 14 is formed, a first polysilicon layer 16 is formed over the silicon dioxide layer 14. In the preferred embodiment, the first polysilicon layer 16 is formed, by using conventional chemical vapor deposition (CVD), to have a thickness about 500–1000 angstroms.

Next, a nitride layer 18 is formed by atop the first polysilicon layer 16 by CVD for the purpose of electrically isolating the first polysilicon layer 16. That is to say the nitride layer 18 acts as an isolation layer to prevent the first polysilicon layer 16 from contacting with a later deposited layer. The thickness of the nitride layer 18 is about 300–1000 angstroms.

Subsequently, a second polysilicon layer 20 is formed on the nitride layer 18 by chemical vapor deposition. In the preferred embodiment, the second polysilicon layer 20 is formed to have a thickness of about 300–1000 angstroms.

Next, a photoresist is patterned onto the second polysilicon layer 20 that delineates an opening 22. The photoresist is removed and the opening 22 is formed by an etching step, such as plasma etching, to etch the second polysilicon layer 20. In this embodiment, the dimension of the opening 22 is about 0.4–0.5 micrometer.

Figure 2:
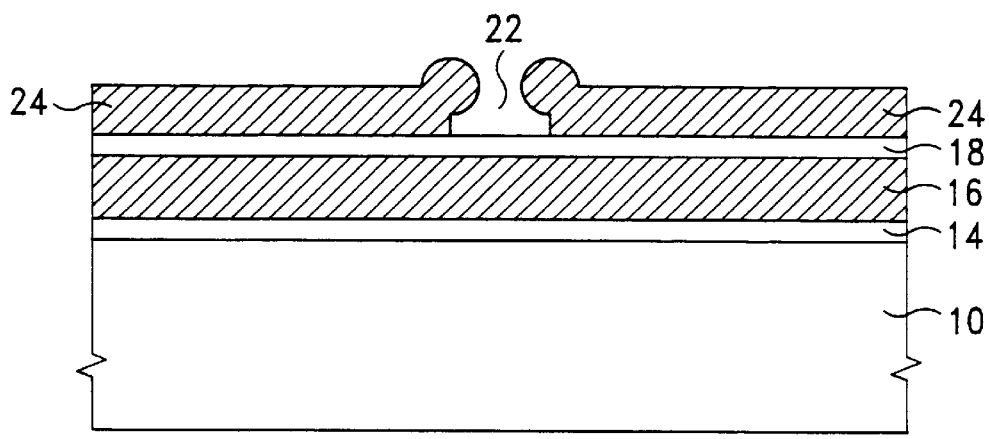
FIG. 2 is a cross section view of a semiconductor wafer illustrating the step of oxidizing the second polysilicon layer in accordance with the present invention.

Turning to FIG. 2, a thermal oxidation step is performed to oxidize the second polysilicon layer 20. The oxidation process expands the volume of the second polysilicon layer 20 thereby narrowing the opening 22. In the process, the second polysilicon layer 20 is transformed into a polysilicon-oxide layer 24. The thermal oxidation is performed in an oxygen-steam ambient, at a temperature of between about 850° to 1000° C. The opening 22 has a dimension after the oxidation that is narrower than that possible using photolithography. The opening 22 may be reduced to 0.2 micrometer by "squeezing" the opening 22 via the thermal oxidation step.

Figure 3:
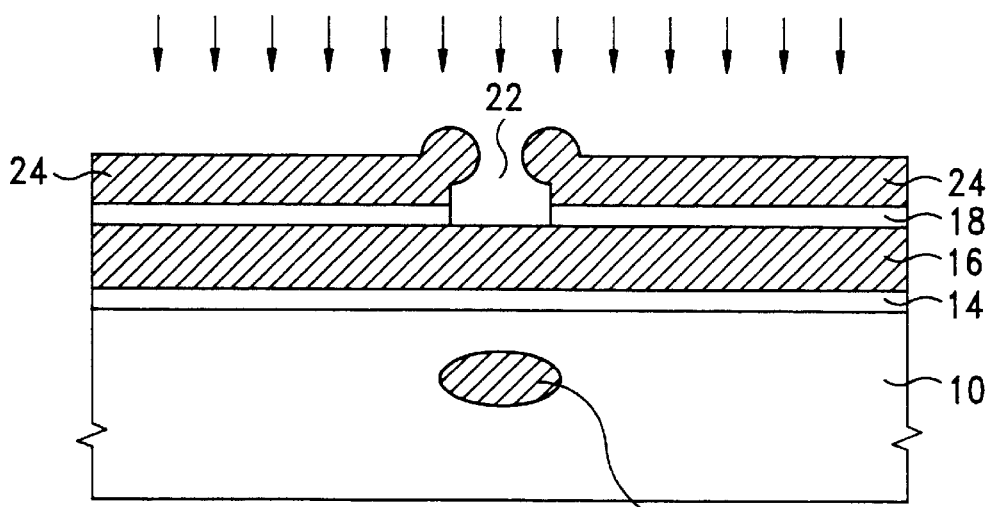
FIG. 3 is a cross section view of a semiconductor wafer illustrating the step of ion implantation to adjust the threshold voltage in accordance with the present invention.

Referring to FIG. 3, the next step of the present invention is to remove the nitride layer 18 in the opening 22 by reactive ion etching. Next, an ion implantation is performed to adjust the threshold voltage by using the polysilicon-oxide layer 24 as a doping mask. A local ion implant region 25 is thus formed to reduce the junction capacitance of the MOSFET. In the preferred embodiment, the energy of the ion implant is about the range of 40–80 eV, 7. The dosage of the ion implant is about the range of 1E13–1E14 atom/cm$^2$.

Figure 4:
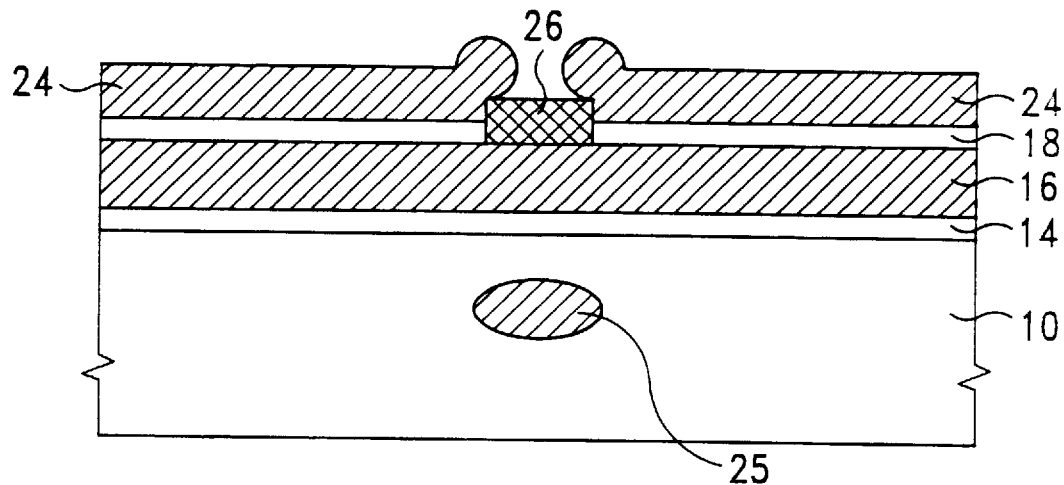
FIG. 4 is a cross section view of a semiconductor wafer illustrating the step of forming a tungsten layer in the opening in accordance with the present invention.

Referring to FIG. 4, a conductive material such as tungsten (W) 26 is selectively grown into the opening 22 by using well known technology. Tungsten is preferred because it is a good metal silicide for use in later process steps. Tungsten is also selected because it can reduce the gate series resistance.

Figure 5:
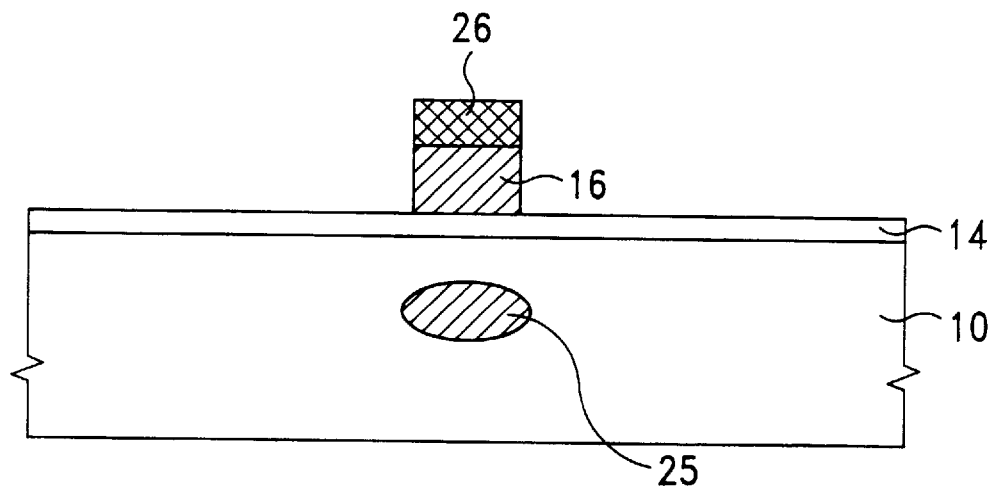
FIG. 5 is a cross section view of a semiconductor wafer illustrating the step of removing the polysilicon-oxide layer, the nitride layer and etching the first polysilicon layer in accordance with the present invention.

Turning to FIG. 5, etching steps are used to remove the polysilicon-oxide layer 24 and the nitride layer 18. In preferred embodiment, the polysilicon-oxide layer 24 is removed by a HF solution. The nitride layer 18 is removed by a hot phosphorus acid solution ($H_3PO_4$). Finally, patterning and etching steps are used to etch the first polysilicon layer 16 to the surface of the gate oxide layer 14, while leaving the portion underneath the tungsten 26 gate. After the gate is formed, ion implant doping can be used to form the source and drain of the MOSFET using known techniques.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a gate for a MOS transistor on a semiconductor substrate, said method comprising the steps of:

forming a gate oxide layer on said semiconductor substrate;

forming a first polysilicon layer on said gate oxide layer;

forming a dielectric layer on said first polysilicon layer for isolating said first polysilicon layer;

forming a second polysilicon layer on said dielectric layer;

etching said second polysilicon layer to form an opening in said second polysilicon layer;

oxidizing said second polysilicon layer into a polysilicon-oxide layer that is expanded in volume relative to said second polysilicon layer thereby narrowing said opening;

performing a local threshold voltage implant by using said polysilicon-oxide layer as an ion implant mask to dope ions into said substrate;

forming a metal in said opening;

removing said polysilicon-oxide layer;

removing said dielectric layer; and patterning and etching said first polysilicon layer to form a gate of said MOS.

2. The method of claim 1 further comprising the step of removing said dielectric layer which is in said opening after oxidizing said second polysilicon layer.

3. The method of claim 2, wherein said dielectric layer is removed by reactive ion etching (RIE).

4. The method of claim 1, wherein said dielectric layer is composed of nitride.

5. The method of claim, 4 wherein said nitride layer is formed to have a thickness of approximately 300–1000 angstroms.

6. The method of claim 1, wherein said first polysilicon layer is formed to have a thickness of approximately 2000–4000 angstroms.

7. The method of claim 1, wherein said second polysilicon layer is formed to have a thickness of approximately 300–1000 angstroms.

8. The method of claim 1, wherein said thermal oxidation is performed in an oxygen-steam ambient, at a temperature between about 850° to 1000° C.

9. The method of claim 1 wherein the dosage of said ion implant is about the range of 1E13–1E14 atom/cm$^2$.

10. The method of claim 9, wherein the energy of said ion implant is about the range of 40–80 eV.

11. The method of claim 1, wherein said metal is tungsten.

12. The method of claim 1, wherein said polysilicon-oxide is removed by using HF solution.

13. The method of claim 4, wherein said dielectric layer is removed by using hot phosphorus acid solution ($H_3PO_4$).

14. A method for forming a gate for a MOS transistor on a semiconductor substrate, the method comprising the steps of:

forming a gate oxide on said semiconductor substrate;

forming a first polysilicon layer atop said gate oxide;

forming an etching isolation layer atop said first polysilicon layer;

forming a second polysilicon layer atop said etching isolation layer;

forming an opening in said second polysilicon layer down to said etching isolation layer;

thermally oxidizing said second polysilicon layer into a polysilicon-oxide layer and to narrow said opening;

removing said etching isolation layer in said opening; and forming a metal contact atop said first polysilicon layer in said opening;

etching away said polysilicon-oxide layer, said remaining etching isolation layer, said first polysilicon layer, and said gate oxide not covered by said metal contact.

* * * * *